(12) United States Patent
Gogoi

(10) Patent No.: US 7,425,485 B2
(45) Date of Patent: Sep. 16, 2008

(54) METHOD FOR FORMING MICROELECTRONIC ASSEMBLY

(75) Inventor: Bishnu P. Gogoi, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 438 days.

(21) Appl. No.: 11/239,986

(22) Filed: Sep. 30, 2005

(65) Prior Publication Data

US 2007/0075394 A1   Apr. 5, 2007

(51) Int. Cl.
*H01L 21/8234* (2006.01)

(52) U.S. Cl. ............ 438/238; 438/381; 257/E27.144

(58) Field of Classification Search ............ 438/238, 438/381
See application file for complete search history.

(56) References Cited

U.S. PATENT DOCUMENTS

| | | | |
|---|---|---|---|
| 6,727,572 B2 | 4/2004 | Maeda et al. | |
| 6,737,727 B2 | 5/2004 | Gates et al. | |
| 6,939,788 B2 * | 9/2005 | Davies | 438/599 |
| 2002/0098611 A1 * | 7/2002 | Chang et al. | 438/50 |
| 2004/0188674 A1 | 9/2004 | Gates et al. | |
| 2005/0012153 A1 | 1/2005 | Ipposhi | |
| 2005/0012175 A1 | 1/2005 | Tsuruta | |
| 2005/0023639 A1 | 2/2005 | Yeh et al. | |

OTHER PUBLICATIONS

Chunbo Zhang et al., Fabrication of thick silicon dioxide layers using DRIE, oxidation and trench refill, MEMS 2002 Conference. pp. 160-163, 2002.
Hongrui Jiang et al., On-chip spiral inductors suspended over deep copper-lined cavities, Microwave Theory and Techniques, IEEE Transactions on, vol. 48, Issue 12, Dec. 2000, pp. 2415-2423.
Guoan Wang et. al., Finite Ground Coplanar lines on CMOS grade silicon with a thick embedded silicon oxide layer using micromachining techniques, Microwave Conference, 2003. 33rd European, vol. 1, Oct. 7-9, 2003 pp. 25-27.
Mina Raieszadeh et al., High Q Integrated Inductors in Trenched silicon islands, MEMS 2005 conference, pp. 199-202.
John D. Brazzle et al., Modeling and characterization of sacrificial polysilicon etching using vapor-phase xenon diflouride, IEEE 2004, pp. 737-740.

* cited by examiner

*Primary Examiner*—Thanh Nguyen
(74) *Attorney, Agent, or Firm*—Ingrassia, Fisher & Lorenz, P.C.

(57) ABSTRACT

A microelectronic assembly and a method for forming the same are provided. The method includes forming first and second lateral etch stop walls in a semiconductor substrate having first and second opposing surfaces. An inductor is formed on the first surface of the semiconductor substrate and a hole is formed through the second surface of the substrate to expose the substrate between the first and second lateral etch stop walls. The substrate is isotropically etched between the first and second lateral etch stop walls through the etch hole to create a cavity within the semiconductor substrate. A sealing layer is formed over the etch hole to seal the cavity.

14 Claims, 8 Drawing Sheets

METHOD FOR FORMING MICROELECTRONIC ASSEMBLY

FIELD OF THE INVENTION

The present invention generally relates to a microelectronic assembly and a method for forming a microelectronic assembly, and more particularly relates to a method for forming an air cavity beneath a spiral inductor.

BACKGROUND OF THE INVENTION

Integrated circuits are formed on semiconductor substrates, or wafers. The wafers are then sawed into microelectronic dies, or semiconductor chips, with each die carrying a respective integrated circuit. Each semiconductor chip is mounted to a package, or carrier substrate, which is often mounted to a motherboard.

The completion of the integrated circuits involves numerous processing steps as well as the formation of various devices on the semiconductor substrate. Depending on the intended use of the semiconductor chip, one of the devices formed on the semiconductor substrate may be an inductor. Spiral inductors are often used in radio frequency (RF) devices and typically include a thin coil of metal formed over a dielectric material. During use, the inductors often experience inductive coupling with the semiconductor material in the substrate, which detrimentally affects the "quality factor," or "Q factor," of the inductor and thus impedes the performance of the device.

To minimize this coupling and increase the Q factor, the thickness of the dielectric layer below the inductor may be increased. However, regardless of the thickness of the dielectric, an appreciable amount of coupling still occurs. Attempts have also been made to create air cavities below the inductors, however the air cavities are not sealed and during subsequent processing steps, such as cleaning and sawing, the air cavity may be contaminated. Furthermore, it is difficult to control the size and shape of the air cavity. The air cavity often significantly decreases the mechanical strength of the semiconductor chip, and as a result, the semiconductor chip may be damaged during packaging or shipping. The thickness of the inductor coil may also be increased to reduce the electrical resistance of the inductor and thus increase the Q factor. However, increasing the thickness of the coil increases the size and adds to the manufacturing costs of the device.

Accordingly, it is desirable to increase the Q factor of the inductor without risking contamination. In addition, it is desirable to maintain sufficient mechanical strength in the semiconductor chip to withstand subsequent processing steps. Furthermore, other desirable features and characteristics of the present invention will become apparent from the subsequent detailed description and the appended claims, taken in conjunction with the accompanying drawings and the foregoing technical field and background.

BRIEF SUMMARY OF THE INVENTION

A method is provided for forming a microelectronic assembly. The method comprises forming first and second lateral etch stop walls in a semiconductor substrate, the substrate having first and second opposing surfaces, forming an inductor on the first surface of the semiconductor substrate, forming an etch hole through the second surface of the substrate to expose the substrate between the first and second lateral etch stop walls, isotropically etching the substrate between the first and second lateral etch stop walls through the etch hole to create a cavity within the semiconductor substrate, and forming a sealing layer over the etch hole to seal the cavity.

An apparatus is provided having an inductor with an improved Q factor. The microelectronic assembly comprises a semiconductor substrate having first and second trenches formed thereon, an etch stop layer on the substrate and in the trenches forming first and second etch stop walls, the substrate and the etch stop layer jointly forming a cavity below the etch stop layer and between the first and second etch stop walls with an etch hole interconnecting the cavity and a first surface of the semiconductor substrate, the etch stop layer comprising an etch stop material, an inductor on a second surface of the semiconductor substrate, at least a portion of the inductor being positioned over the cavity in the semiconductor substrate, and a sealing layer formed over the etch hole at the first surface of the semiconductor substrate.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description is merely exemplary in nature and is not intended to limit the invention or application and uses of the invention. Furthermore, there is no intention to be bound by any expressed or implied theory presented in the preceding technical field, background, brief summary, or the following detailed description. It should also be noted that FIGS. 1-17 are merely illustrative and may not be drawn to scale.

Figure 1:
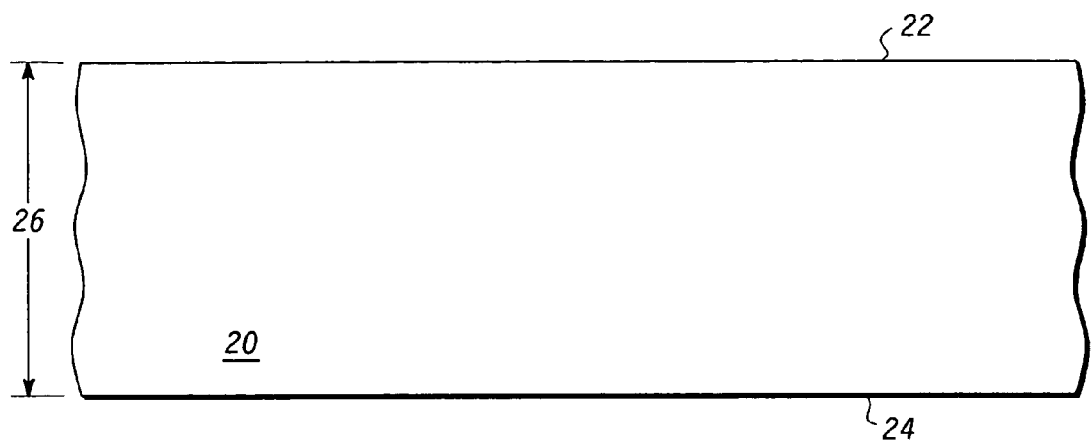
FIG. 1 is a cross-sectional side view of a semiconductor substrate.

FIGS. 1-13 illustrate a method for forming a microelectronic assembly including a spiral inductor, according to one embodiment of the present invention. Referring to FIG. 1, there is illustrated a semiconductor substrate 20. The semiconductor substrate 20 is made of a semiconductor material, such as silicon, and includes an upper surface 22 and a lower surface 24. The substrate 20 may have a thickness 26 of approximately 1,000 microns. Although only a portion of the semiconductor substrate 20 is illustrated, it should be understood that the substrate 20 may be a semiconductor wafer with a diameter of, for example, 200 or 300 millimeters.

Figure 2:
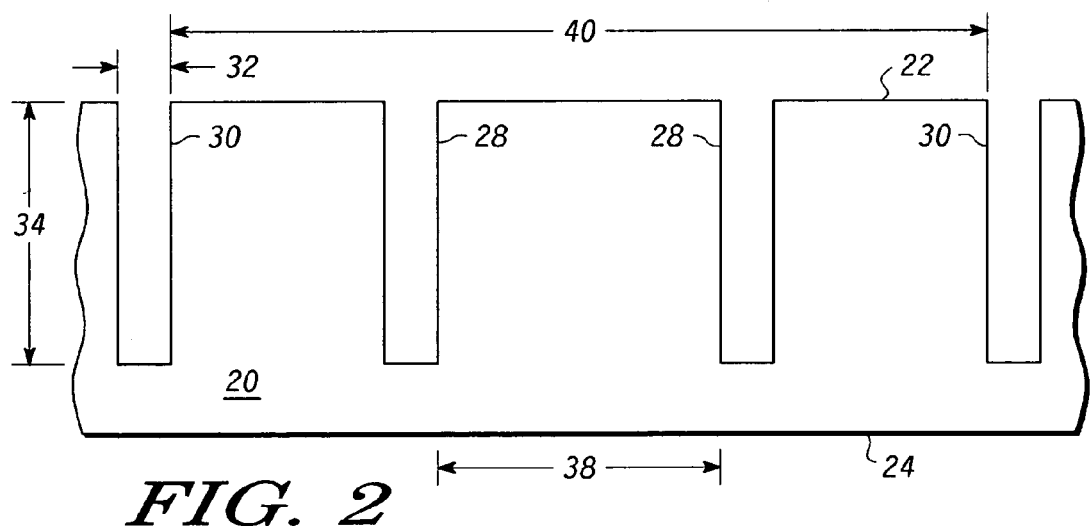
FIG. 2 is a cross-sectional side view of the semiconductor substrate of FIG. 1 after a plurality of trenches have been formed on an upper surface thereof.
Figure 4:
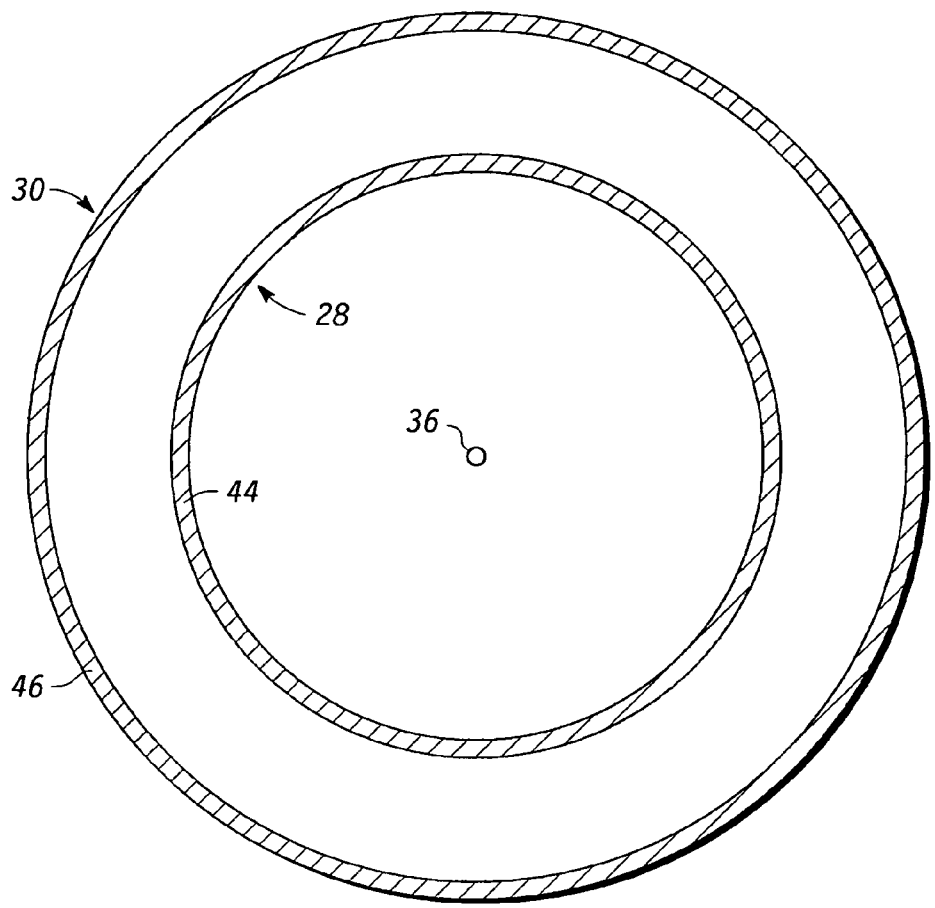
FIG. 4 is a top plan view of first and second lateral etch stop walls of formed from the field oxide layer of FIG. 3.

As illustrated in FIG. 2, a first trench 28 and second trench 30 are first formed in the upper surface 22 of the semiconductor substrate 20. The first 28 and the second 30 trenches have, for example, a width 32 of between 8 and 10 microns and a depth 34 of between 75 and 100 microns. The first trench 28 and the second trench 30 are formed using Deep Reactive Ion Etching (DRIE), and as illustrated in FIG. 4, when viewed from above are circular in shape and concentric about a trench, or inductor, center point 36. Referring again to FIG. 2, in an exemplary embodiment, the first trench 28 has an inner diameter 38 of approximately 300 microns, and the second trench 30 has an inner diameter 40 of approximately 500 microns.

Figure 3:
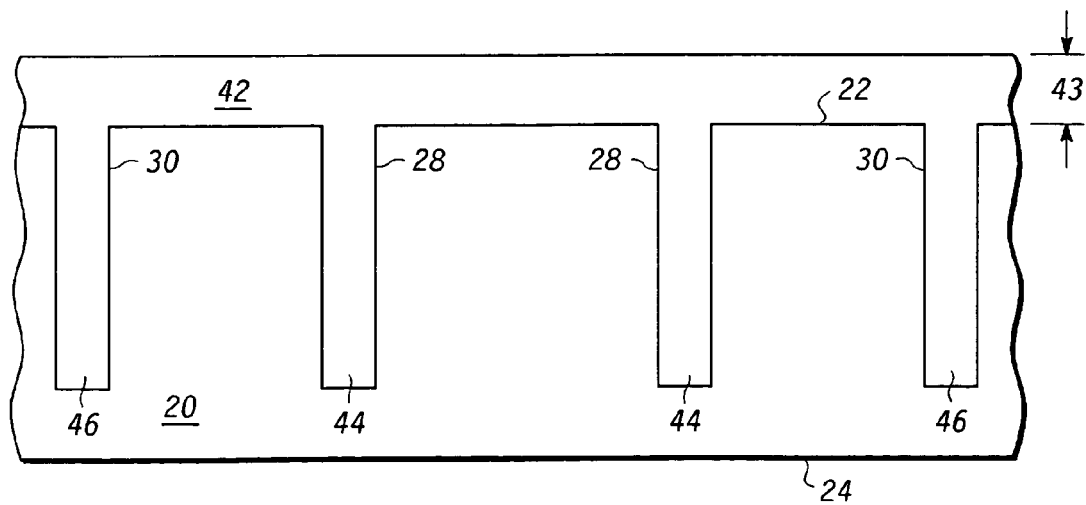
FIG. 3 is a cross-sectional side view of the semiconductor substrate of FIG. 2 with a field oxide layer formed on the upper surface.

Referring to FIG. 3, a field oxide, or "etch stop," layer 42 is formed on the upper surface 22 of the semiconductor substrate 20. The field oxide layer 42 is thermally grown, as is commonly understood in the art, to a thickness 43 of, for example, between 4 and 6 microns. As illustrated, the field oxide layer 42 fills the first trench 28 and second trench 30 to form a first lateral etch stop wall 44 within the first trench 28 and a second lateral etch stop wall 46 in the second trench 30. As illustrated in both FIGS. 3 and 4, the first lateral etch stop wall 44 and the second lateral etch stop wall 46 assume the size and shape of the first and second trenches 28 and 30, respectively. Therefore, although not illustrated in detail, the first lateral etch stop wall 44 has approximately the same diameter as the first trench 28, and the second lateral etch stop wall 46 has approximately the same the same diameter as the second trench 30, as illustrated in FIG. 2.

Figure 5:
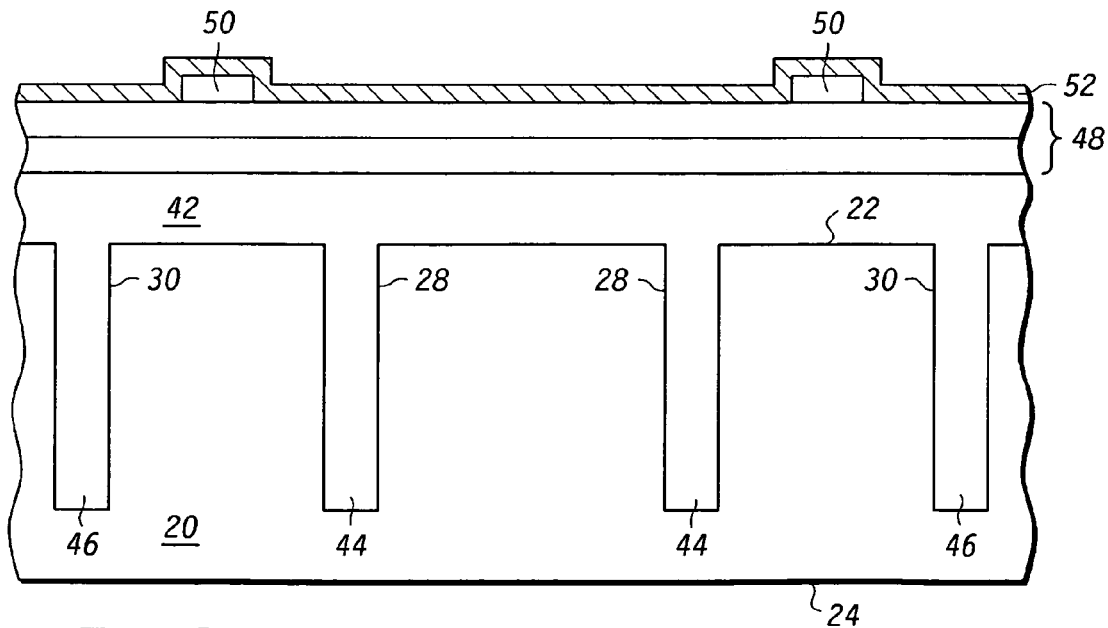
FIG. 5 is a cross-sectional side view of the semiconductor substrate of FIG. 3 after an inductor, including a coil, has been formed on the top surface.

Multiple complementary metal oxide semiconductor (CMOS) processing steps are then performed on the semiconductor substrate 20 over the field oxide layer 42, as shown in FIG. 5. The CMOS processing steps include, for example, the formation of CMOS devices, multiple interlayer dielectric layers 48, metal layers or metal lines 50, and a passivation layer 52 formed over the metal lines 50 and the interlayer dielectric layers 48. The metal lines 50 may be made of materials such as aluminum, copper, or aluminum silicon. The passivation layer 52 may be formed using plasma enhanced chemical vapor deposition (PECVD) and may be made of such materials as silicon nitride or silicon oxide.

Figure 6:
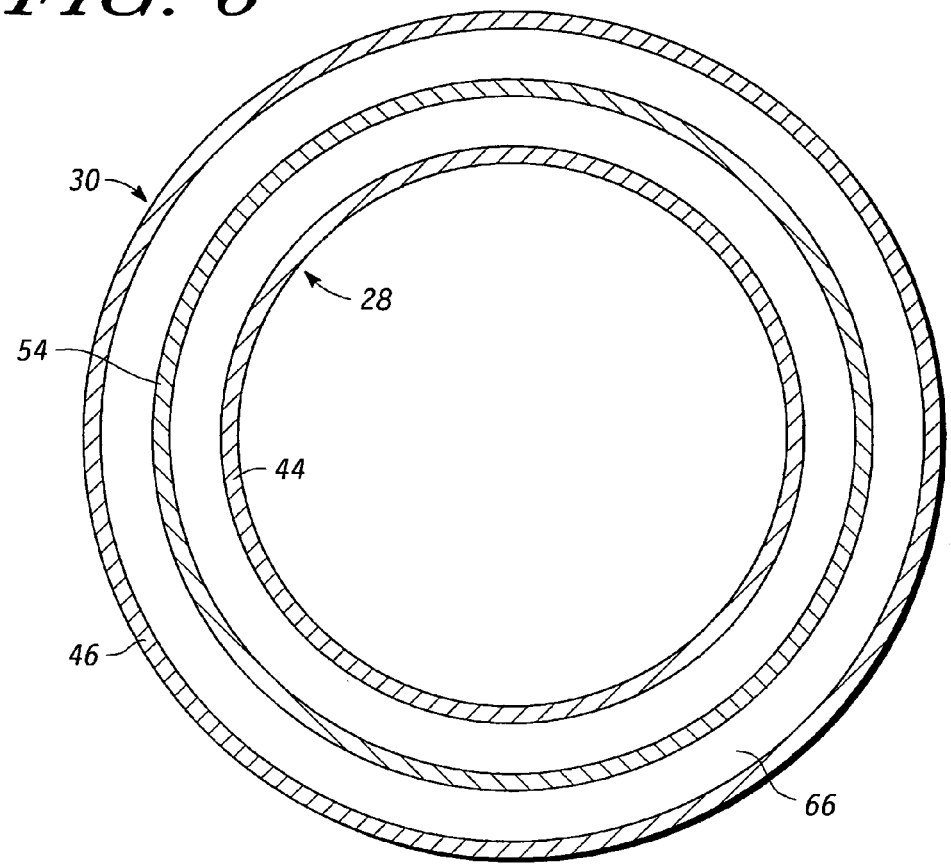
FIG. 6 is a top plan view of the semiconductor substrate of FIG. 5 illustrating the placement of the coil compared to the first and second lateral etch stop walls.
Figure 7:
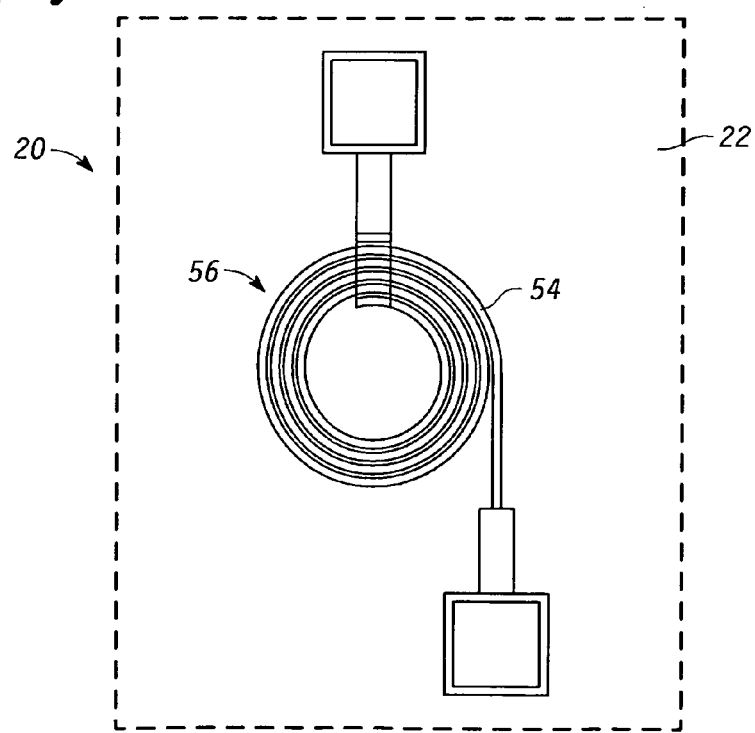
FIG. 7 is a top plan view of the semiconductor substrate of FIG. 5 illustrating the inductor.

At least a portion of the metal lines 50 form coils 54 over the upper surface 22 of the semiconductor substrate 20, as illustrated in FIGS. 6 and 7. Referring specifically to FIG. 6, at least some of the coils 54 are located between the first lateral etch stop wall 44 and the second lateral etch stop wall 46.

Referring now to FIG. 5 together with FIG. 7, the combination of the field oxide layer 42, the interlayer dielectric layers 48, the metal lines 50, and the formation of the coils 54, forms a spiral inductor 56, as is commonly understood in the art, on, or over, the upper surface 22 of the semiconductor substrate 20. Although not specifically illustrated, the spiral inductor 56 may have a diameter of between 300 and 500 microns and a thickness of between 2 and 5 microns.

Figure 8:
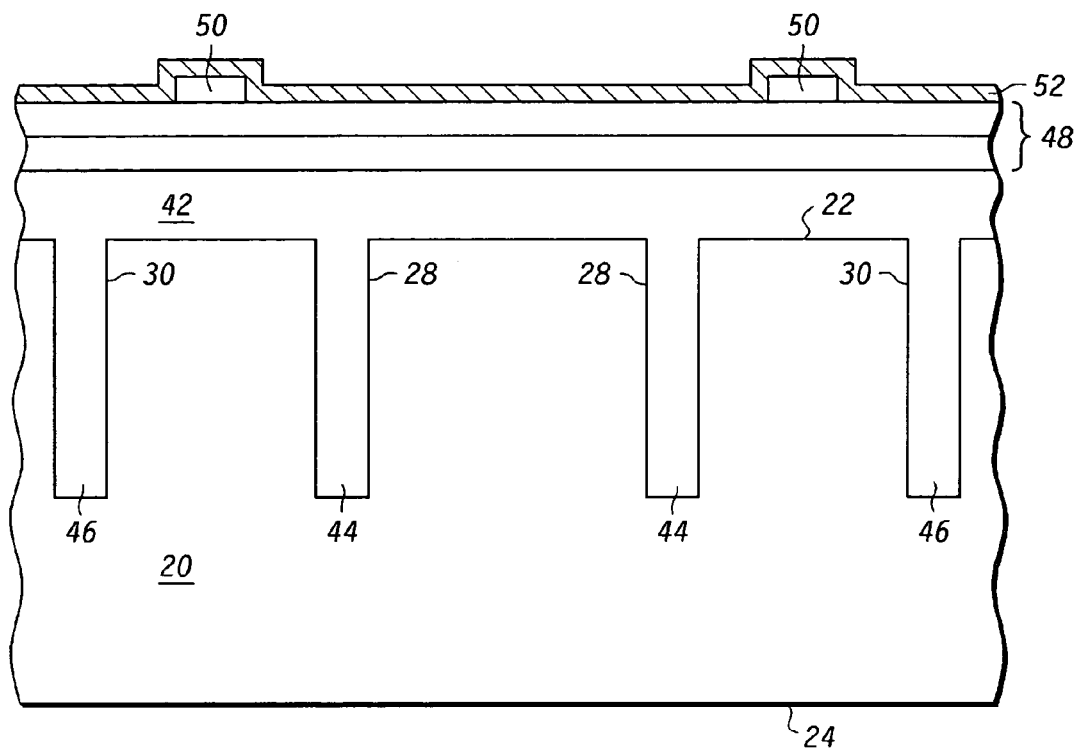
FIGS. 8 and 9 are cross-sectional side views of the semiconductor substrate of FIG. 5 illustrating a thinning process being performed on the substrate.
Figure 9:
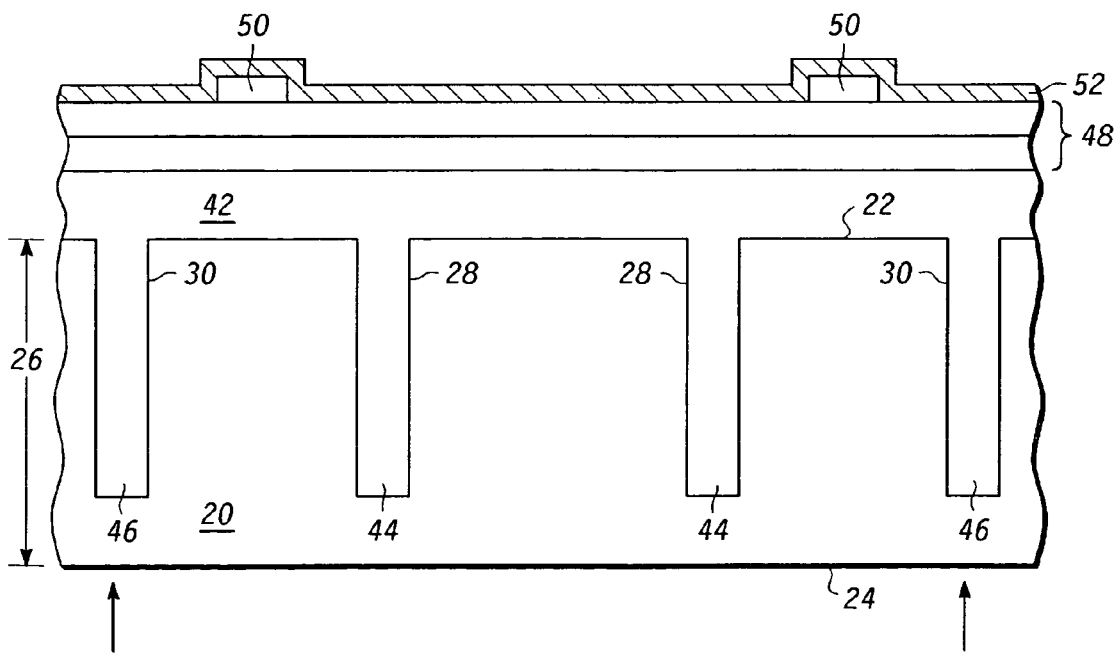

As shown in FIGS. 8 and 9, the substrate 20 is then "thinned," as is commonly understood in the art. The thinning may be performed on the lower surface 24, or "backside," by grinding, polishing, etching, chemical mechanical polishing (CMP), or any combination thereof. As shown specifically in FIG. 9, the thinning process may reduce the thickness 26 of the substrate 20 to between 75 and 100 microns.

Figure 10:
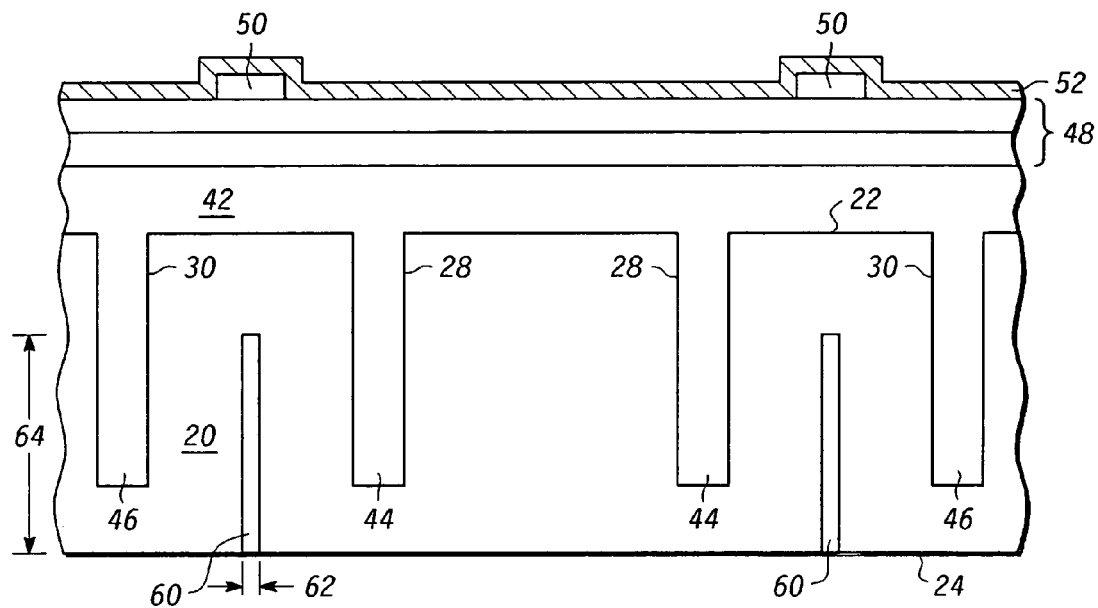
FIG. 10 is a cross-sectional side view of the semiconductor substrate of FIG. 9 after a plurality of etch holes have been formed in the lower surface thereof.

A plurality of etch holes 60 are then formed through the lower surface 24 of the substrate 20, as shown in FIG. 10. The etch holes 60 are formed using DRIE and have, for example, a width 62 of between 4 and 6 microns and a depth 64 of between 40 and 50 microns. The etch holes 60 may extend into the portions of the substrate 20 between the first lateral etch stop wall 44 and the second lateral etch stop wall 46. Although not specifically illustrated, numerous etch holes 60 may be formed between the first lateral etch stop wall 44 and the second lateral etch stop wall 46 and arranged in a circular pattern around the trench center point 36, as shown in FIG. 6.

Figure 11:
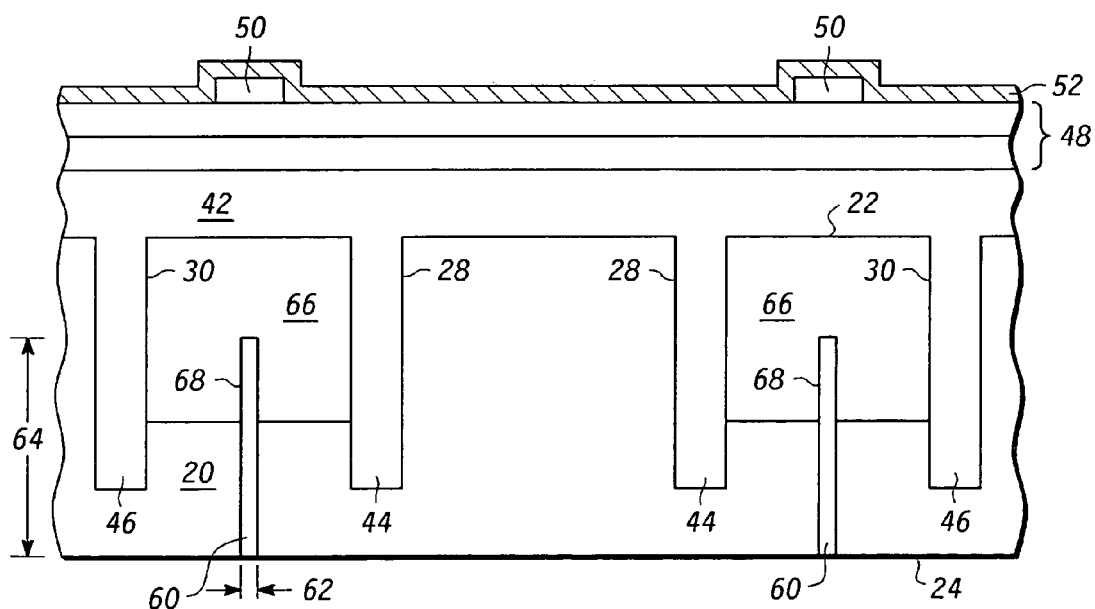
FIG. 11 is a cross-sectional side view of the semiconductor substrate of FIG. 10 after undergoing an isotropic etching process.

As illustrated in FIG. 11, the semiconductor substrate 20 then undergoes an isotropic etching process. In a preferred embodiment, the substrate 20 is exposed to xenon difluoride ($XeF_2$) which passes through the etch holes 60 and isotropically etches the semiconductor material of the substrate 20 between the first lateral etch stop wall 44 and second lateral etch stop wall 46. It should be noted that $XeF_2$ has a very high etch rate for silicon, such as 0.5 microns per minute and extremely low etch rates for sputtered titanium, stochiometric silicon nitride, thermal oxide, PECVD silicon nitride, and aluminum. Therefore, as illustrated in FIG. 7, as the $XeF_2$ passes through the etch holes 60, the first lateral etch stop wall 44 and second lateral etch stop wall 46 undergo essentially no etching, while the silicon between the first lateral etch stop wall 44 and the second lateral etch stop wall 46 undergoes a very rapid isotropic etching process. Thus, as illustrated, an air cavity 66 is formed between the first lateral etch stop wall 44 and second lateral etch stop wall 46 and directly below at least one of the coils 54 of the spiral inductor 56. Because the etching is laterally blocked by the first lateral etch stop wall 44 and the second lateral etch stop wall 46, the formation of the air cavity 66 only progresses vertically at a high rate. Referring again to FIG. 6, the air cavity 66 is ring shaped with dimensions similar to the space between the first lateral etch stop wall 44 and second lateral etch stop wall 46. A depth of the air cavity 66 may be between 30 and 40 microns and is determined by the amount of time that the semiconductor material is exposed to the isotropic etching gas.

As shown in FIG. 11, as the etching process takes place, polymeric columns 68 are left where the etch holes 60 were located. As will be appreciated by one skilled in the art, the polymeric columns 68 are formed during the DRIE process that is used to form the etch holes 60. The polymeric columns 68 may be made of a polymer which is etched very slowly by the isotropic etching gas. Therefore, the silicon within the substrate 20 that is adjacent to the polymeric columns 68 is not immediately etched. After the etching process is complete, the polymeric columns 68 may extend into the air cavity 66 and have similar dimensions to those of the etch holes 60. The polymeric columns 68 may be removed using an oxygen plasma ashing process, as is commonly understood in the art.

Figure 12:
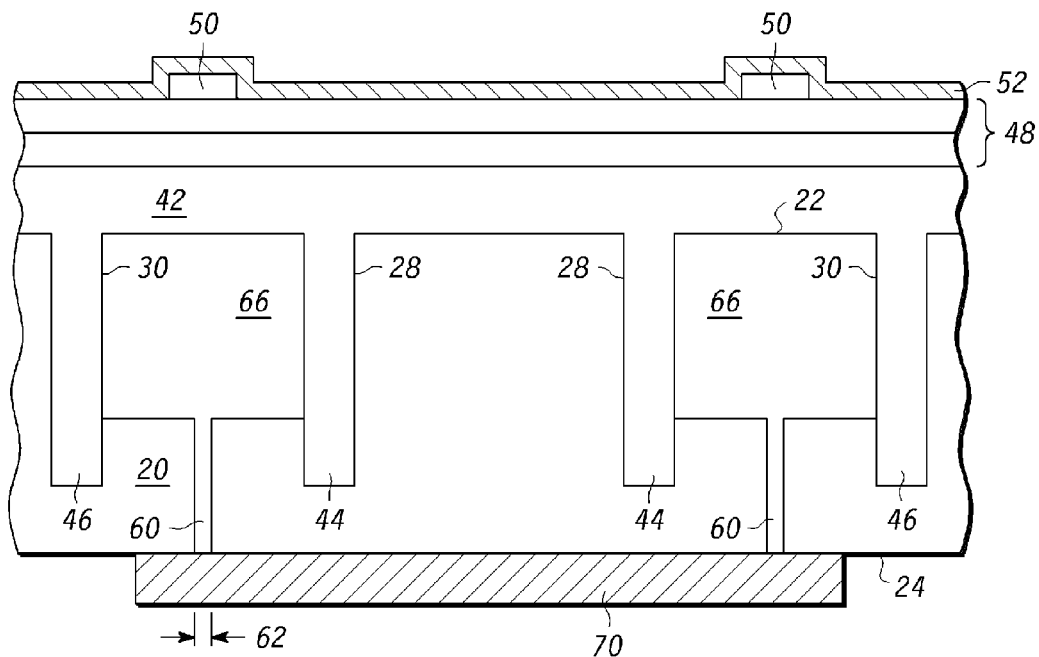
FIG. 12 is a cross-sectional side view of the semiconductor substrate of FIG. 11 after a sealing layer has been formed on the lower surface thereof.

A sealing, or second, passivation layer 70 is then formed on the backside 24 of the substrate 20 to completely cover the etch holes 60 and thus seal the air cavity 66, as illustrated in FIG. 12. The sealing passivation layer 70 may be made of, for example, tetra-ethyl-ortho-silicate (TEOS), silicon oxide, or silicon nitride. The thickness of the sealing passivation layer 70 may be, for example, between 6 and 8 microns, depending on the widths 62 of the etched holes 60. The sealing passivation layer 70 may also be patterned and etched to expose portions of the backside 24 of the substrate 20.

Figure 13:
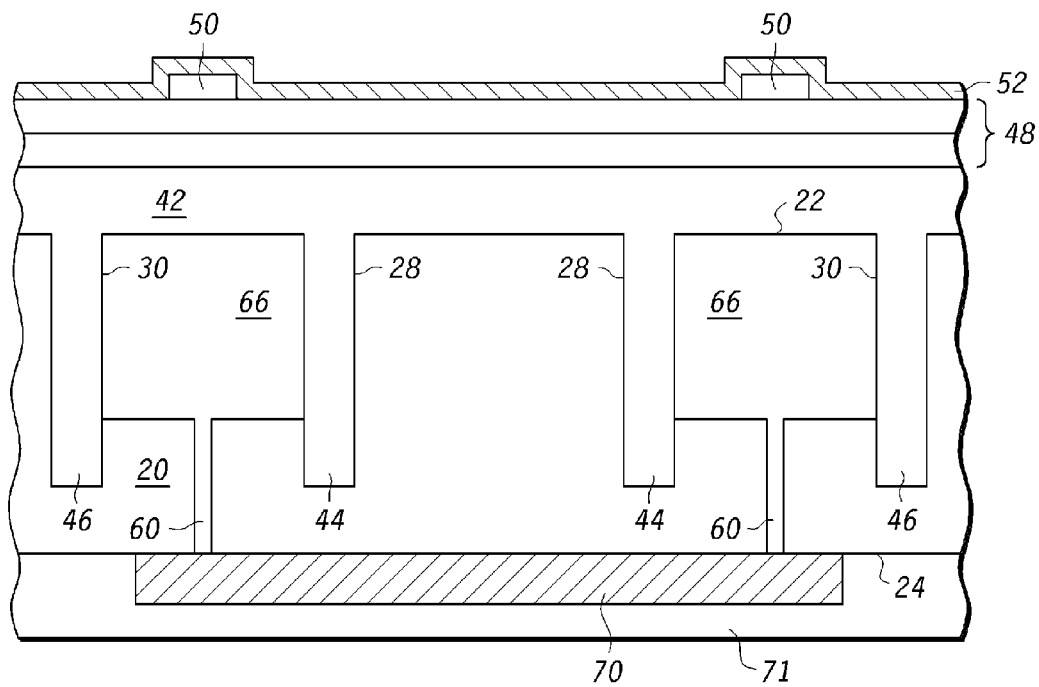
FIG. 13 is a cross-sectional side view of the semiconductor substrate of FIG. 12 after undergoing a metallization process.

Referring to FIG. 13, a metallization process may then be performed on the backside 24 of the substrate 20 to form a backside metal layer 71 over the sealing passivation layer 70. The backside metal layer 71 may, for example, be made of aluminum or copper and have a thickness of between 10 and 15 microns.

After final processing steps, the semiconductor substrate 20 may be sawed into individual microelectronic dies, or semiconductor chips, which each chip carrying a respective integrated circuit. The semiconductor chips may then be attached to a package substrate before being installed into computing system. Referring to FIG. 7, electric signals may be sent through the coil 54 of the spiral inductor 56 which causes an electromagnetic field to be created around the inductor 56, as is commonly understood in the art.

The assembly has several advantages. First, because of the insulating properties of air, the coupling between the coil and the substrate is reduced, thereby increasing the Q factor of the inductor. Furthermore, because the air cavity is sealed with the sealing passivation layer, the possibility of the air cavity being contaminated during subsequent processing steps is minimized. Additionally, the use of the etch stop walls allows for the size, shape, and placement of the air cavity to be accurately controlled as well as improves the mechanical strength of the assembly. Therefore, the possibility of the assembly being damaged during subsequent processing steps, packaging, or shipping is reduced.

Figure 14:
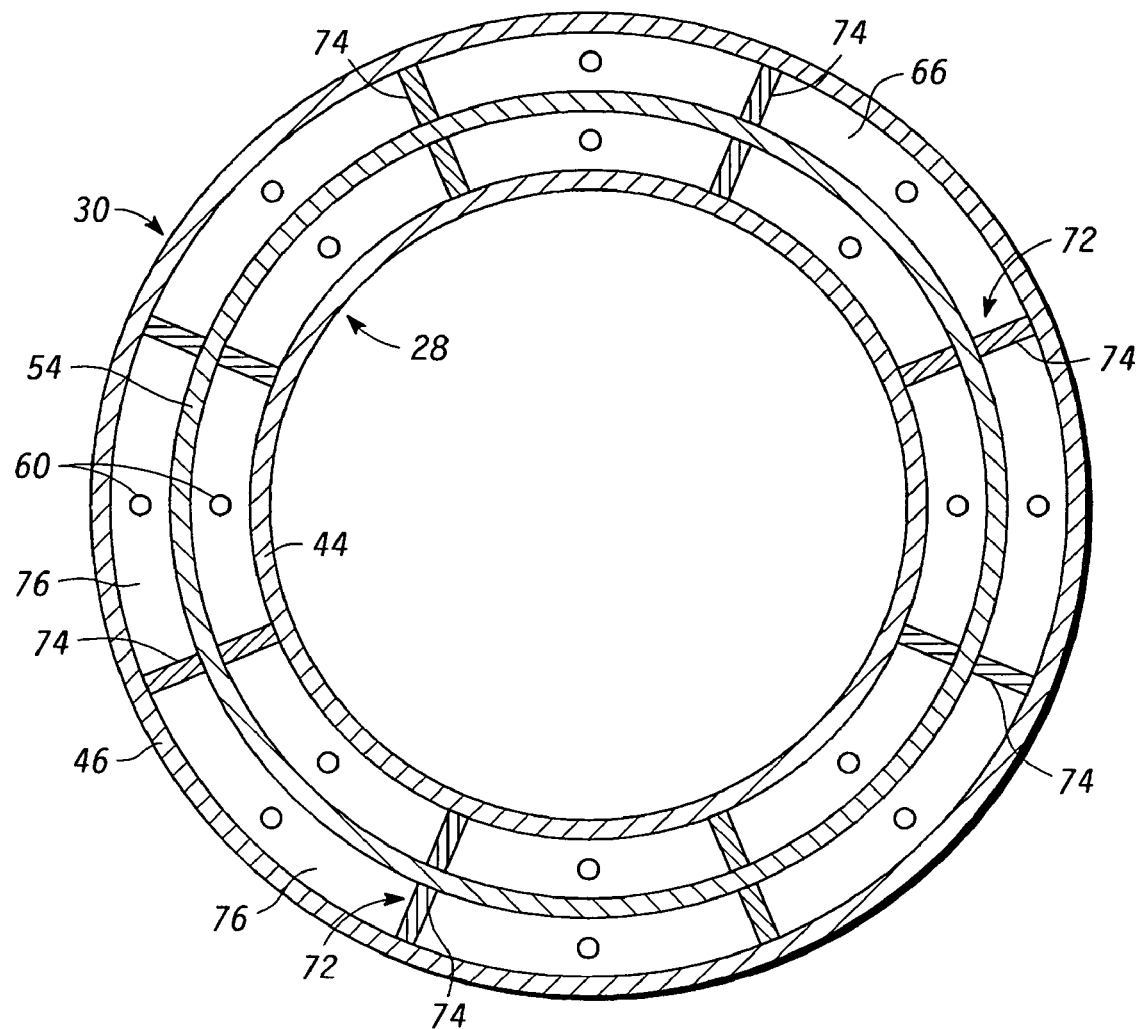
FIG. 14 is a top plan view illustrating a lateral etch stop wall configuration according to another embodiment of the present invention.

FIG. 14 illustrates a lateral etch stop wall layout, as shown in FIGS. 4, 6, and 9, according to an alternative embodiment of the present invention. To construct the lateral etch stop wall configuration as illustrated in FIG. 13, a third set of trenches 72 are etched which interconnect the first trench 28 and the second trench 30. During the formation of the field oxide layer 42, in a manner similar to that illustrated in FIG. 3, the third set of trenches 72 are also filled with the field oxide layer 42 to create multiple support walls 74 which interconnect the first and second 46 lateral etch stop walls 44 and 46, respectively. In the example illustrated in FIG. 13, the etch holes 60 are arranged so that only one pair of etch holes 60 lies between two successive support walls 74. Therefore, when the semiconductor substrate is exposed to the isotropic etching gas, the air cavity 66 formed is divided into multiple air cavity chambers 76, with each air cavity 76 being defined by the first lateral etch stop wall 44, the second lateral etch stop wall 46, and successive support walls 74. This embodiment provides the additional advantage of adding additional structural support and mechanical strength to the assembly due to the support walls 74.

Figure 15:
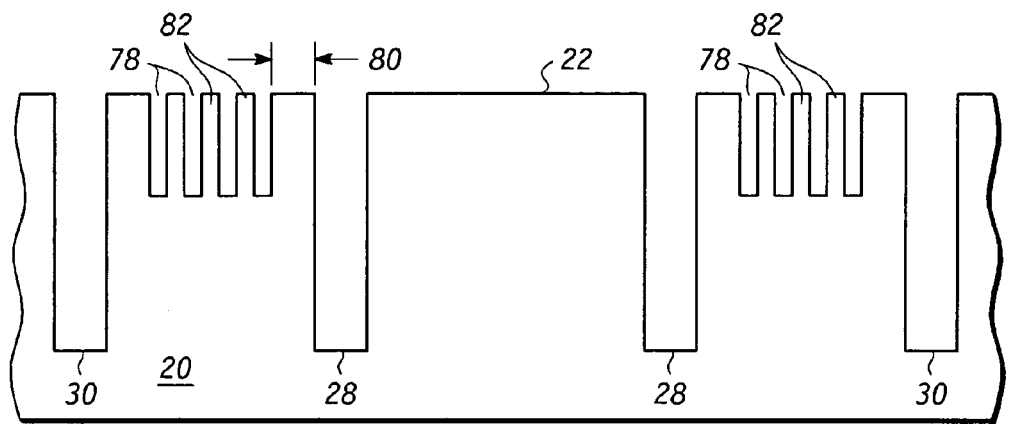
FIGS. 15-17 are cross-sectional side views of a semiconductor substrate illustrating the formation of a lateral etch stop wall configuration according to a further embodiment of the present invention.
Figure 16:
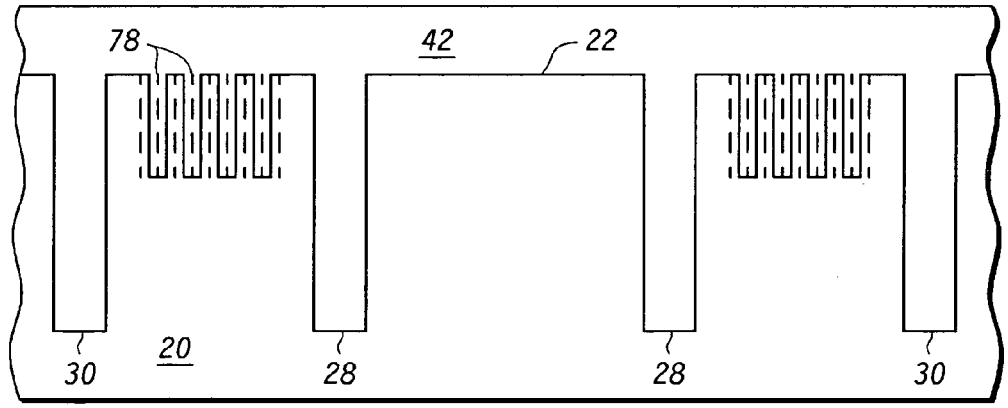
Figure 17:
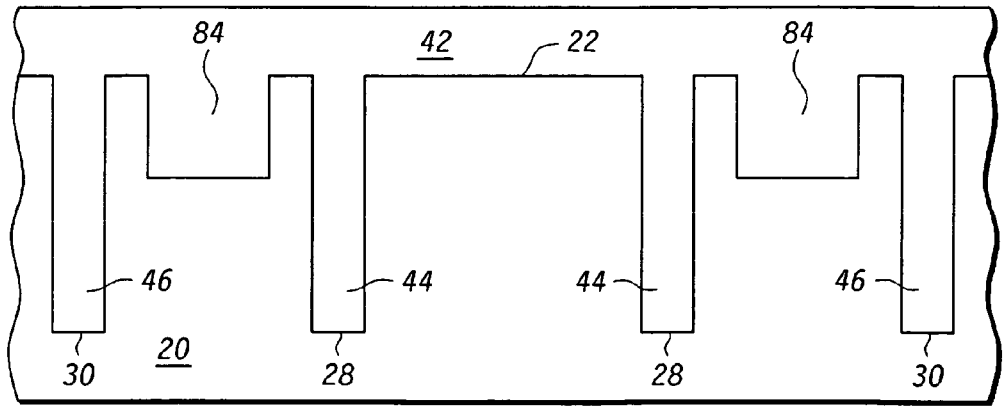

FIGS. 15-17 illustrate the formation of an etch stop wall configuration according to a still further embodiment of the present invention. As shown in FIG. 15, a first trench 28 and a second trench 30 are formed in the semiconductor substrate 20 a manner similar to that shown in FIG. 2. However, as illustrated, multiple support structure formation trenches 78 are also formed in the upper surface 22 of the semiconductor substrate between the first trench 28 and the second trench 30. Although not illustrated in detail, the support structure formation trenches 78 have, for example, widths of approximately 2 microns and depths of approximately 10 microns. A gap 80 may be left in the upper surface 22 of the semiconductor substrate 20 of, for example, approximately 8 microns between the first trench 28 and the second trench 30 and the support structure formation trenches 78.

It should also be noted that the support structure formation trenches 78 may be closely spaced to form semiconductor members 82 from the semiconductor material of the semiconductor substrate 20 between the support structure formation trenches 78. As shown, a region on the substrate 20 between the first trench 28 and the second trench 30 may be covered with alternating support structure formation trenches 78 and semiconductor members 82. The semiconductor members 82 may have widths similar to the widths of the support structure formation trenches 78.

As illustrated in FIG. 16, a field oxide layer 42 may then be formed on the upper surface 22 of the semiconductor substrate 20, in a similar fashion to that shown in FIG. 3. The field oxide layer 42 may completely fill the first trench 28 and the second trench 30 by oxidation, as well as completely oxidize the support structure formation trenches 78.

However, as the field oxide layer 42 is formed, or grown, onto the semiconductor material of the semiconductor substrate 20, due to the oxidation of the semiconductor material of the substrate 20, the oxide becomes partially "embedded" into the uppermost surface of the semiconductor substrate 20, as shown in FIGS. 16 and 17. This oxidation combined with the minute widths of the semiconductor members 82 causes the entire members 82 to change into the oxide material of the field oxide layer 42. Therefore, the region of the substrate 20 which was occupied by the support structure formation trenches 78 and the semiconductor members 82 becomes entirely made of the field oxide material. As a result, an annular support member 84, or stiffener, is formed which extends downward from, and is integral with, the field oxide layer 42 between the first and second lateral etch stop walls, 44 and 46 respectively, as shown in FIG. 17.

In the example illustrated in FIG. 17, because the annular support member 84 is composed of an oxide, during the etching process, the annular support member 84 undergoes essentially no etching so that in cross-section the air cavity 66 takes on a "U-shape." In this case, the annular support member 84 provides additional mechanical strength to the entire semiconductor substrate 20.

The invention provides a method for forming a microelectronic assembly. The method may include forming first and second lateral etch stop walls in a semiconductor substrate, the substrate having first and second opposing surfaces, forming an inductor on the first surface the semiconductor substrate, forming an etch hole through the second surface of the substrate to expose the substrate between the first and second lateral etch stop walls, isotropically etching the substrate between the first and second lateral etch stop walls through the etch hole to create a cavity within the semiconductor substrate, and forming a sealing layer over the etch hole to seal the cavity.

The method may also include positioning at least a portion of the inductor over the cavity. The inductor may include a coil wrapped around an inductor center point on the semiconductor substrate. The first and second lateral etch stop walls may be formed around the inductor center point. The first lateral etch stop wall may be positioned between the inductor center point and the second lateral etch stop wall, and both the first and second lateral etch stop walls may be centered on the inductor center point. The formation of the etch hole may be performed using Deep Reactive Ion Etching (DRIE). The method may also include forming an etch stop layer having an etch stop material on the first surface of the semiconductor substrate to form the first and second lateral etch stop walls.

The invention also provides a method for forming a microelectronic assembly which may include forming first and second trenches on a first surface of a semiconductor substrate, the semiconductor substrate comprising a semiconductor material, forming an etch stop layer over the first surface of the semiconductor substrate, the etch stop layer filling the first and second trenches, forming an inductor on the first surface of the semiconductor substrate, forming an etch hole through a second surface of the semiconductor substrate to expose the semiconductor material between the first and second trenches, isotropically etching the semiconductor material between the first and second trenches through the etch hole to create a cavity within the semiconductor substrate, and forming a sealing layer over the second surface of the semiconductor substrate to seal the cavity.

The first surface of the semiconductor substrate may be an upper surface, and the second surface of the semiconductor substrate may be a lower surface. The first and second trenches may be formed around a trench center point with the first trench being positioned between the trench center point and the second trench.

The inductor may include a coil wrapped around the trench center point, and at least a portion of the coil may be positioned over the cavity. The first and second trenches may have a substantially circular shape, and the cavity may have an annular ring shape.

The formation of the etch hole may be performed using Deep Reactive Ion Etching (DRIE). The method may also include forming a metal layer on the lower surface of the semiconductor substrate over the sealing layer.

The invention further provides a microelectronic assembly. The microelectronic assembly may include a semiconductor substrate having first and second trenches formed thereon, an etch stop layer on the substrate and in the trenches forming first and second etch stop walls, the substrate and the etch stop layer jointly forming a cavity below the etch stop layer and between the first and second etch stop walls with an etch hole interconnecting the cavity and a first surface of the semiconductor substrate, the etch stop layer comprising an etch stop material, an inductor on a second surface of the semiconductor substrate, at least a portion of the inductor being positioned over the cavity in the semiconductor substrate, and a sealing layer formed over the etch hole at the first surface of the semiconductor substrate.

The first surface of the semiconductor substrate may oppose the second surface of the semiconductor substrate. The inductor may include at least one coil wrapped around an inductor center point on the semiconductor substrate, and the first and second trenches may be formed around the inductor center point. The first trench may be between the inductor center point and the second trench, the first and second trenches may have a substantially circular shape, and the cavity may have an annular ring shape.

The microelectronic assembly may also include a plurality of support walls interconnecting the first and second etch stop walls. The microelectronic assembly may also include an annular support member comprising the etch stop material extending from an inner surface of the cavity and a metal layer formed on the lower surface of the semiconductor substrate over the sealing layer.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a microelectronic assembly, comprising:
   forming first and second lateral etch stop walls in a semiconductor substrate, the substrate having first and second opposing surfaces;
   forming an inductor on the first surface of the semiconductor substrate;
   forming an etch hole through the second surface of the substrate to expose the substrate between the first and second lateral etch stop walls;
   isotropically etching the substrate between the first and second lateral etch stop walls through the etch hole to create a cavity within the semiconductor substrate; and
   forming a sealing layer over the etch hole to seal the cavity.

2. The method of claim 1, further comprising positioning at least a portion of the inductor over the cavity.

3. The method of claim 2, wherein the inductor comprises a coil wrapped around an inductor center point on the semiconductor substrate.

4. The method of claim 3, wherein the first and second lateral etch stop walls are formed around the inductor center point.

5. The method of claim 4, wherein the first lateral etch stop wall is positioned between the inductor center point and the second lateral etch stop wall and both the first and second lateral etch stop walls are centered on the inductor center point.

6. The method of claim 5, wherein said isotropic etching is performed using xenon difluoride.

7. The method of claim 6, further comprising forming an etch stop layer comprising an etch stop material on the first surface of the semiconductor substrate to form the first and second lateral etch stop walls.

8. A method for forming a microelectronic assembly, comprising:
   forming first and second trenches on a first surface of a semiconductor substrate, the semiconductor substrate comprising a semiconductor material;
   forming an etch stop layer over the first surface of the semiconductor substrate, the etch stop layer filling the first and second trenches;
   forming an inductor on the first surface of the semiconductor substrate;
   forming an etch hole through a second surface of the semiconductor substrate to expose the semiconductor material between the first and second trenches;
   isotropically etching the semiconductor material between the first and second trenches through the etch hole to create a cavity within the semiconductor substrate; and
   forming a sealing layer over the second surface of the semiconductor substrate to seal the cavity.

9. The method of claim 8, wherein the first surface of the semiconductor substrate is an upper surface and the second surface of the semiconductor substrate is a lower surface.

10. The method of claim 9, wherein the first and second trenches are formed around a trench center point with the first trench being positioned between the trench center point and the second trench.

11. The method of claim 10, wherein the inductor comprises a coil wrapped around the trench center point and at least a portion of the coil is positioned over the cavity.

12. The method of claim 11, wherein the first and second trenches have a substantially circular shape and the cavity has an annular ring shape.

13. The method of claim 12, wherein said formation of the etch hole is performed using Deep Reactive Ion Etching (DRIE).

14. The method of claim 13, further comprising forming a metal layer on the lower surface of the semiconductor substrate over the sealing layer.

* * * * *